United States Patent
Cho et al.

(10) Patent No.: US 12,353,729 B2
(45) Date of Patent: *Jul. 8, 2025

(54) TRIPLE ACTIVATE COMMAND ROW ADDRESS LATCHING

(71) Applicant: Micron Technology, Inc., Boise, ID (US)

(72) Inventors: Kwang-Ho Cho, Boise, ID (US); Miki Matsumoto, Boise, ID (US); Kevin J. Ryan, Elizabeth, CO (US)

(73) Assignee: Micron Technology, Inc., Boise, ID (US)

( * ) Notice: Subject to any disclaimer, the term of this patent is extended or adjusted under 35 U.S.C. 154(b) by 206 days.

This patent is subject to a terminal disclaimer.

(21) Appl. No.: 17/899,222

(22) Filed: Aug. 30, 2022

(65) Prior Publication Data
US 2024/0069759 A1 Feb. 29, 2024

(51) Int. Cl.
*G06F 3/06* (2006.01)

(52) U.S. Cl.
CPC .......... *G06F 3/0625* (2013.01); *G06F 3/0629* (2013.01); *G06F 3/0659* (2013.01); *G06F 3/0673* (2013.01)

(58) Field of Classification Search
CPC .... G06F 3/0625; G06F 3/0629; G06F 3/0659; G06F 3/0673
See application file for complete search history.

(56) References Cited

U.S. PATENT DOCUMENTS

| | | | |
|---|---|---|---|
| 11,615,831 B2* | 3/2023 | Yamamoto | G11C 11/40618 365/222 |
| 2003/0007388 A1* | 1/2003 | Kawai | G11C 16/08 365/185.22 |
| 2004/0177210 A1* | 9/2004 | Choi | G11C 29/1201 711/154 |
| 2007/0002623 A1* | 1/2007 | Won | G11C 16/08 365/185.12 |
| 2013/0083611 A1* | 4/2013 | Ware | G06F 3/0625 365/191 |
| 2023/0162803 A1* | 5/2023 | Zhang | G11C 16/0483 365/185.24 |

* cited by examiner

*Primary Examiner* — Prasith Thammavong
(74) *Attorney, Agent, or Firm* — Holland & Hart LLP

(57) ABSTRACT

Methods, systems, and devices for triple activate command row address latching are described. For instance, a memory device may receive a first activate command that indicates a first set of bits of a row address, a second activate command that indicates a second set of bits of the row address, and a third activate command that indicates a third set of bits of the row address. The memory device may activate a page of memory based on receiving the first activate command, the second activate command, and the third activate command, where the page of memory is addressed according to the first set of bits, the second set of bits, and the third set of bits.

35 Claims, 7 Drawing Sheets

TRIPLE ACTIVATE COMMAND ROW ADDRESS LATCHING

FIELD OF TECHNOLOGY

The following relates to one or more systems for memory, including triple activate command row address latching.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Figure 1:
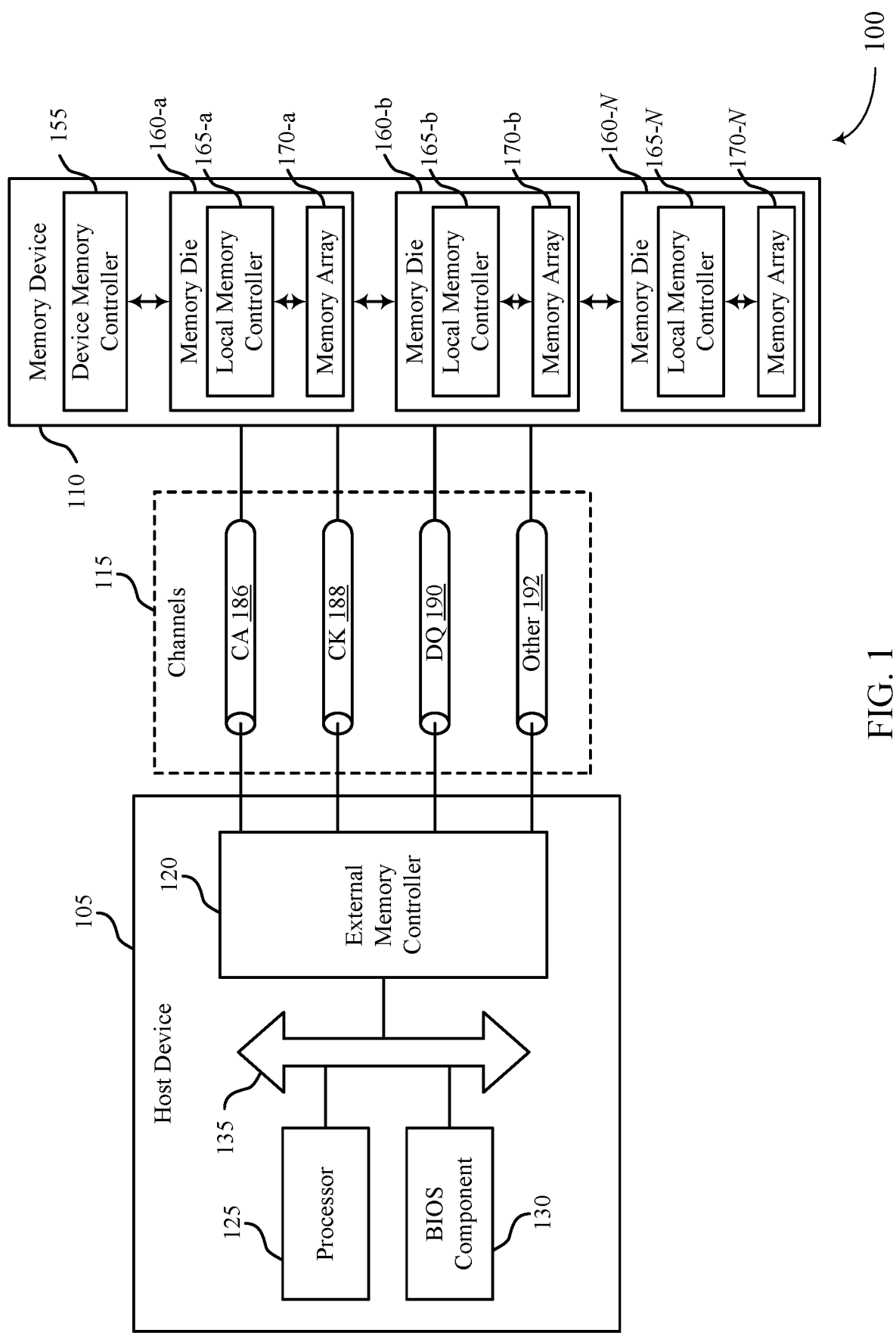
FIG. 1 illustrates an example of a system that supports triple activate command row address latching in accordance with examples as disclosed herein.

In some examples, a memory device may include a memory array made up of memory cells arranged according to a quantity of columns and a quantity of rows. The row where the memory cell is located may have an associated row address and the column where the memory cell is located may have an associated column address. In order to access a memory cell, the memory device may activate a row line associated with the row address for the memory cell. As the quantity of columns for a memory increases, the amount of data that may be accessed by activating a given row line may also increase (e.g., increasing the quantity of columns may provide greater accessibility of data once a page has been opened). However, increasing the quantity of columns may also be associated with an increased amount of power that is consumed per row access operation.

In some examples, a memory device may activate a row of a memory bank based on multiple activate commands. For instance, the memory device may receive a first activate command (e.g., Activate 0) that indicates a first set of bits of a row address and a second activate command (e.g., Activate 1) that indicates a second set of bits of the row address. The memory device may open the page indicated by the row address upon receiving the second activate command. To support larger memory sizes without the increase in power consumption from greater quantities of columns for each page, a memory device may activate a row of a memory bank based on more than two activate commands. For example, in addition to the first and second activate commands the memory device may receive a third activate command (e.g., Activate 2) that indicates a third set of bits of the row address. The memory device may store the first set of bits at a first one or more storage elements, the second set of bits at a second one or more storage elements, and the third set of bits at a third one or more storage elements. After storing the first set of bits, the second set of bits, and the third set of bits at the respective storage elements, the memory device may activate a page associated with the row address addressed by the first set of bits, the second set of bits, and the third set of bits.

In some examples, a first instance of the first activate command may be received before a first instance of the second activate command, and the first instance of the second activate command may be received before a first instance of the third activate command, where the third activate command may trigger the access (e.g., accessing the row and/or opening the page). In some such examples, the memory device may receive a second instance of the first activate command and may replace the first set of bits at the one or more first storage elements with a fourth set of bits indicated by the second instance of the first activate command. In some examples in which timing between the first instance of the third activate command and the second instance of the first activate command is not constrained or restricted according to a minimum threshold duration, the memory device may attempt to activate a page associated with an incorrect or invalid address, as the one or more second latches and one or more third latches may store bits of a first row address (e.g., the second set of bits and the third set of bits) and the one or more first latches may store bits of a second row address (e.g., the fourth set of bits). The combination of the second set of bits, the third set of bits, and the fourth set of bits may indicate an invalid or incorrect row address, as opposed to the combination of the first set of bits, the second set of bits, and the third set of bits, which may indicate a correct or valid row address.

In order to support flexible activate timing such that the second instance of the first activate command may be received at any instance after the first instance of the third activate command while still mitigating the memory device attempting to activate a page associated with an incorrect or invalid row address, the memory device may store the first set of bits at one or more fourth storage elements at a same time that the memory device stores the third set of bits at the one or more third storage elements and/or the second set of bits at the one or more second storage elements. Then, when activating the page, the memory device may use the row address indicated by the first set of bits stored at the one or more fourth storage elements, the second set of bits stored at the one or more second storage elements, and the third set of bits stored at the one or more third storage elements. As such, in examples that the memory device receives the second instance of the first activate command and stores the fourth set of bits at the one or more first storage elements, the memory device will not attempt to activate a page associated with a row address indicated by the fourth set of bits, the second set of bits, and the third set of bits.

Figure 2:
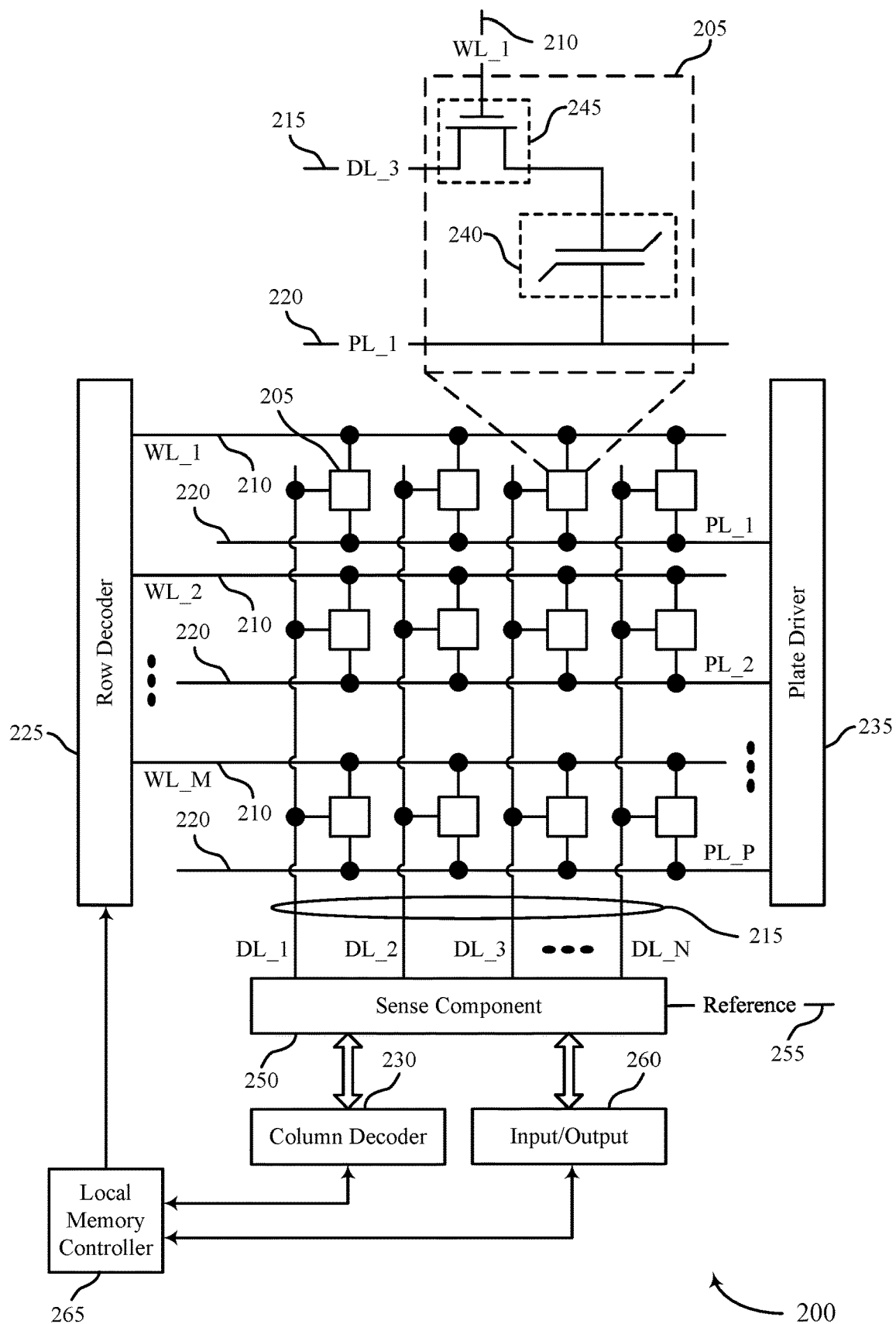
FIG. 2 illustrates an example of a memory die that supports triple activate command row address latching in accordance with examples as disclosed herein.

Features of the disclosure are initially described in the context of systems and dies with reference to FIGS. 1 and 2. Features of the disclosure are described in the context timing diagrams and a circuit with reference to FIGS. 3 through 5. These and other features of the disclosure are further illustrated by and described with reference to an apparatus diagram and flowcharts that relate to triple activate command row address latching as described with reference to FIGS. 6 and 7.

FIG. 1 illustrates an example of a system 100 that supports triple activate command row address latching in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s) (e.g., input devices, output devices). The I/O controller may manage peripherals that are not integrated into or with the system 100 or the host device 105. In some examples, the I/O controller may represent a physical connection (e.g., one or more ports) with external peripheral components.

In some examples, the system 100 or the host device 105 may include an input component, an output component, or both. An input component may represent a device or signal external to the system 100 that provides information (e.g., signals, data) to the system 100 or its components. In some examples, and input component may include an interface (e.g., a user interface or an interface between other devices). In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, clock signal channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. A symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), among others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a first instance of the first activate command may be received before a first instance of the second activate command, and the first instance of the second activate command may be received before a first instance of the third activate command, where the third activate command may trigger the access (e.g., accessing the row and/or opening the page). In some such examples, the memory device 110 may receive a second instance of the first activate command and may replace the first set of bits at the one or more first storage elements with a fourth set of bits indicated by the second instance of the first activate command. In some examples in which timing between the first instance of the third activate command and the second instance of the first activate command is not constrained or restricted according to a minimum threshold duration, the memory device 110 may attempt to activate a page associated with an incorrect or invalid address, as the one or more second latches and one or more third latches may store bits of a first row address (e.g., the second set of bits and the third set of bits) and the one or more first latches may store bits of a second row address (e.g., the fourth set of bits). The combination of the second set of bits, the third set of bits, and the fourth set of bits may indicate an invalid or incorrect row address, as opposed to the combination of the first set of bits, the second set of bits, and the third set of bits, which may indicate a correct or valid row address.

In order to support flexible activate timing such that the second instance of the first activate command may be received at any instance after the first instance of the third activate command while still mitigating the memory device 110 attempting to activate a page associated with an incorrect or invalid row address, the memory device 110 may store the first set of bits at one or more fourth storage elements at a same time that the memory device 110 stores the third set of bits at the one or more third storage elements and/or the second set of bits at the one or more second storage elements. Then, when activating the page, the memory device 110 may use the row address indicated by the first set of bits stored at the one or more fourth storage elements, the second set of bits stored at the one or more second storage elements, and the third set of bits stored at the one or more third storage elements. As such, in examples that the memory device 110 receives the second instance of the first activate command and stores the fourth set of bits at the one or more first storage elements, the memory device 110 will not attempt to activate a page associated with a row address indicated by the fourth set of bits, the second set of bits, and the third set of bits.

FIG. 2 illustrates an example of a memory die 200 that supports triple activate command row address latching in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may be operable to perform a read operation (e.g., a sense operation) on one or more memory cells 205 of the memory die 200. During a read operation, the state (e.g., logic state, charge state, polarization state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250 (e.g., latch the sense component) and compare the signal received from the memory cell 205 to a reference (e.g., the reference 255). Based on that comparison, the sense component 250 may determine a logic state that is stored on the memory cell 205.

In some examples, a first instance of the first activate command may be received before a first instance of the second activate command, and the first instance of the second activate command may be received before a first instance of the third activate command, where the third activate command may trigger the access (e.g., accessing the row and/or opening the page). In some such examples, the memory device may receive a second instance of the first activate command and may replace the first set of bits at the one or more first storage elements with a fourth set of bits indicated by the second instance of the first activate command. In some examples in which timing between the first instance of the third activate command and the second instance of the first activate command is not constrained or restricted according to a minimum threshold duration, the memory device may attempt to activate a page associated with an incorrect or invalid address, as the one or more second latches and one or more third latches may store bits of a first row address (e.g., the second set of bits and the third set of bits) and the one or more first latches may store bits of a second row address (e.g., the fourth set of bits). The combination of the second set of bits, the third set of bits, and the fourth set of bits may indicate an invalid or incorrect row address, as opposed to the combination of the first set of bits, the second set of bits, and the third set of bits, which may indicate a correct or valid row address.

In order to support flexible activate timing such that the second instance of the first activate command may be received at any instance after the first instance of the third activate command while still mitigating the memory device attempting to activate a page associated with an incorrect or invalid row address, the memory device may store the first set of bits at one or more fourth storage elements at a same time that the memory device stores the third set of bits at the one or more third storage elements and/or the second set of bits at the one or more second storage elements. Then, when activating the page, the memory device may use the row address indicated by the first set of bits stored at the one or more fourth storage elements, the second set of bits stored at the one or more second storage elements, and the third set of bits stored at the one or more third storage elements. As such, in examples that the memory device receives the second instance of the first activate command and stores the fourth set of bits at the one or more first storage elements, the memory device will not attempt to activate a page associated with a row address indicated by the fourth set of bits, the second set of bits, and the third set of bits.

Figure 3:
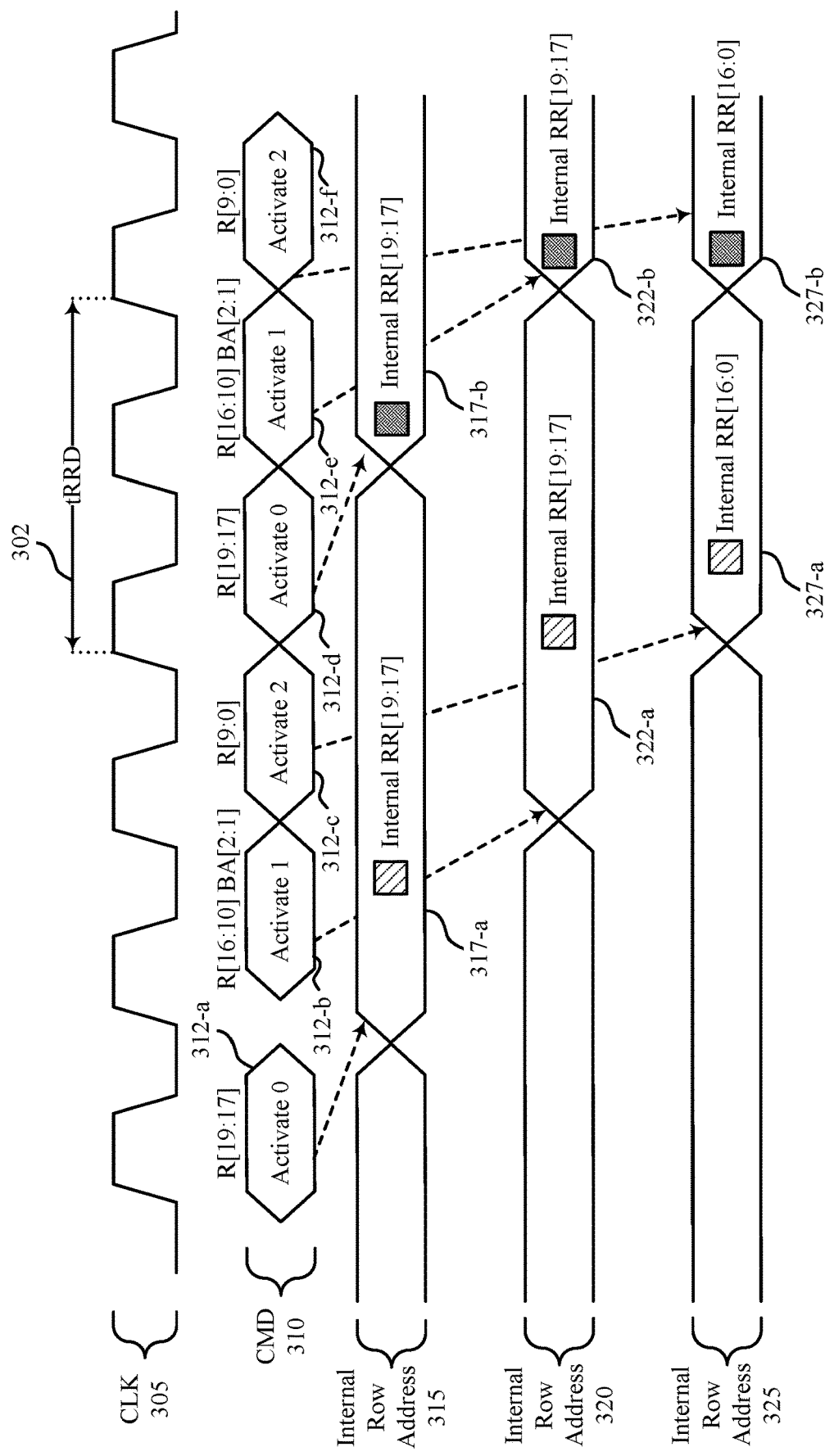
FIG. 3 illustrates an example of a timing diagram that supports triple activate command row address latching in accordance with examples as disclosed herein.

FIG. 3 illustrates an example of a timing diagram 300 that supports triple activate command row address latching in accordance with examples as disclosed herein. In some examples, functions of volatile memory may be performed by non-volatile memory. For instance, information stored in volatile memory may instead be stored in non-volatile memory. Non-volatile memory systems that reduce the amount of column addressing may use additional row address bits to support a same memory size as compared to non-volatile memory systems with a non-reduced amount of column addressing. In order to accommodate for the use of additional bits without widening a command address bus width, a memory device may receive multiple activate commands (e.g., more than two activate commands), where each activate command may include a portion of the bits of the row address.

Clock signal 305 may represent a signal produced by a clock (e.g., a clock from a host device coupled with the memory device). Command signal 310 may represent signals associated with one or more commands received by the memory device (e.g., activate commands 312-*a* through 312-*f*). Internal row address signals 315, 320, and 325 may each represent signals output by storage elements that store bits associated with the one or more commands. For instance, internal row address signal 315 may be associated with the output of one or more first storage elements that store bits indicated by Activate 0 commands (e.g., commands 312-*a* and 312-*d*); internal row address signal 320 may be associated with the output of one or more second storage elements that store bits indicated by Activate 0 commands (e.g., commands 312-*a* and 312-*d*); and internal row address signal 325 may be associated with the output of one or more third storage elements that store bits indicated by Activate 1 and Activate 2 commands (e.g., commands 312-*c* and 312-*f*). The time between two clock periods may be given as tRRD 302 (e.g., a row to row delay).

At a first time, the memory device may receive a first Activate 0 command (e.g., command 312-*a*) that may indicate a first set of bits (e.g., row address bits 17 through 19). In response to receiving the Activate 0, the memory device may store the first set of bits at the one or more first storage elements to obtain delayed signal 317-*a*. After receiving the Activate 0, the memory device may receive an Activate 1 (e.g., command 312-*b*) that may indicate a second set of bits (e.g., row address bits 10 through 16). In some examples, the Activate 1 may also include bank address information (e.g., 3 bits indicating a bank address). In response to receiving the Activate 1, the memory device may store the first set of bits at the one or more second storage elements to obtain delayed signal 322-*a*. After receiving the Activate 1, the memory device may receive an Activate 2 (e.g., command 312-*c*) that may indicate a third set of bits (e.g., row address bits 0 through 9). In response to receiving the Activate 2, the memory device may store the second set of bits and the third set of bits at the one or more third storage elements to obtain delayed signal 327-*a*. After storing the first set of bits at the one or more second storage elements and the second set of bits and the third set of bits at the one or more third storage elements, the memory device may activate a page associated with the row address indicated by the first set of bits, the second set of bits, and the third set of bits. In some examples, the memory device may store the first set of bits at the one or more second storage elements in response to receiving the Activate 2 (e.g., instead of in response to receiving the Activate 1).

After receiving the Activate 2, the memory device may receive a second Activate 0 command 213-*d* that may indicate a fourth set of bits (e.g., second row address bits 17 through 19). In response to receiving the other Activate 0, the memory device may store the fourth set of bits at the one or more first storage elements to obtain delayed signal 317-*b*. After receiving the other Activate 0, the memory device may receive another Activate 1 (e.g., command 322-*e*) that may indicate a fifth set of bits (e.g., second row address bits 16 through 10). Additionally, the other Activate 1 may include an updated bank address (e.g., 3 bits). In response to receiving the other Activate 1, the memory device may store the fourth set of bits at the one or more second storage elements to obtain delayed signal 322-*b*. After receiving the other Activate 1, the memory device may receive another Activate 2 (e.g., command 312-*g*) that may indicate a sixth set of bits (e.g., second row address bits 0 through 9). In response to receiving the other Activate 2, the memory device may store the fifth set of bits and the sixth set of bits at the one or more third storage elements to obtain delayed signal 327-*b*. After storing the fourth set of bits at the one or more second storage elements and the fifth set of bits and the sixth set of bits at the one or more third storage elements, the memory device may activate a page associated with the row address indicated by the fourth set of bits, the fifth set of bits, and the sixth set of bits.

In some examples, including one or more second storage elements to store the first set of bits may enable the memory device to support flexible timing for the second instance of the first activate command (e.g., timing such that the second instance of the first activate command may be received at any instance after the third activate command). For instance, delayed signal 317-*b* associated with the one or more first storage elements storing the fourth set of bits may overlap in time with delayed signal 327-*b* associated with the one or more third storage elements storing the second set of bits and the third set of bits. Accordingly, in examples in which the memory device does not have the one or more second storage elements and the memory device activates the page based on the bits stored at the one or more first storage elements, the memory device may attempt to activate a page with an address indicated by the fourth set of bits (for row address bits 17 through 19) and the second and third sets of bits (e.g., for row address bits 0 through 16). Such an address may be incorrect or invalid. As such, having the one or more second storage elements to store the first set of bits may prevent or assist in preventing the memory device from attempting to activate a page associated with an incorrect or invalid address in at least some examples.

Figure 4:
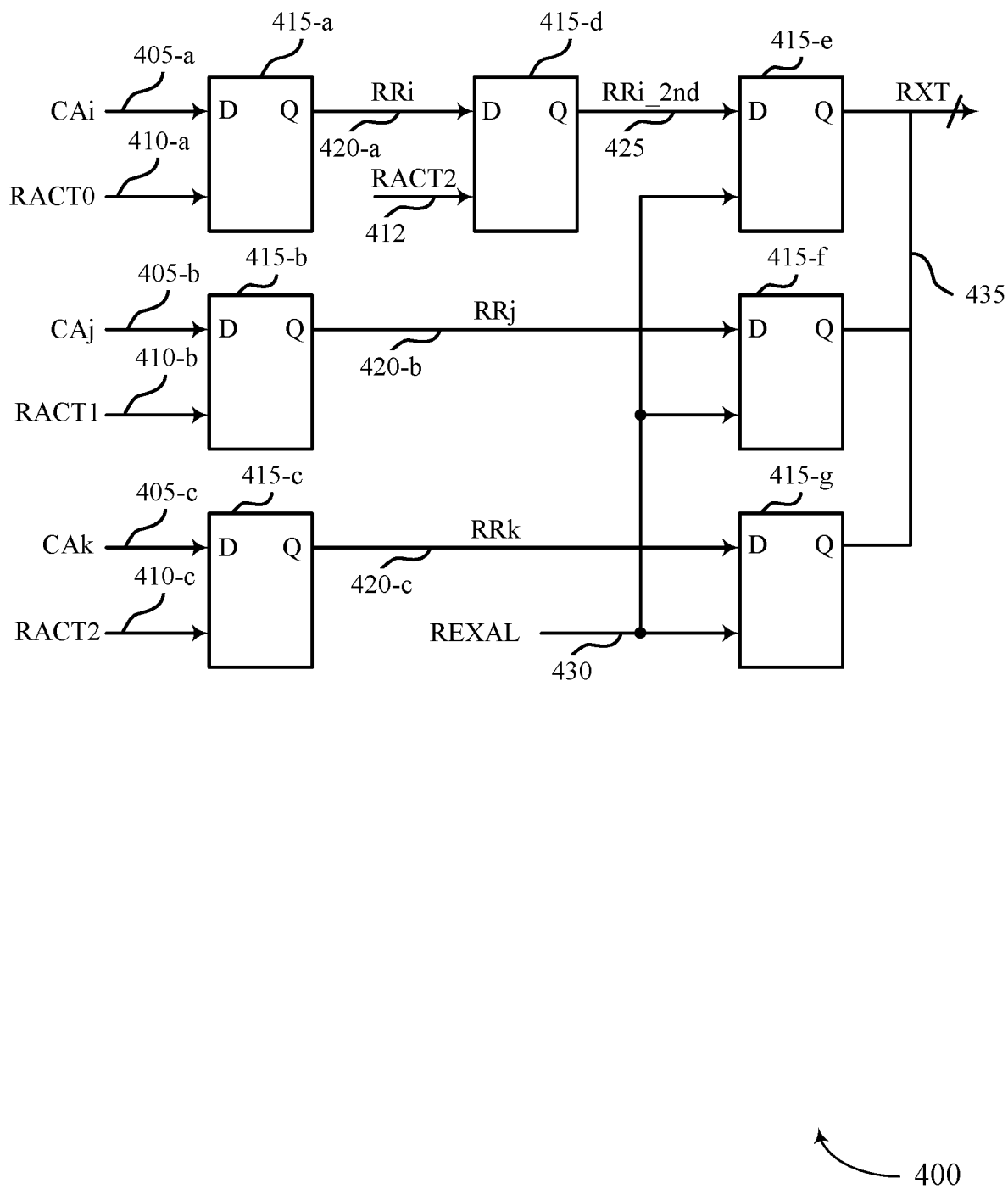
FIG. 4 illustrates an example of a circuit that supports triple activate command row address latching in accordance with examples as disclosed herein.

FIG. 4 illustrates an example of a circuit 400 that supports triple activate command row address latching in accordance with examples as disclosed herein. Circuit 400 may include one or more first storage elements 415-*a*, one or more second storage elements 415-*b*, one or more third storage elements 415-*c*, one or more fourth storage elements 415-*d*, one or more fifth storage elements 415-*e*, one or more sixth storage elements 415-*f*, and one or more seventh storage elements 415-*g*. In some examples, each storage element of one or more first storage elements 415-*a*, one or more second storage elements 415-*b*, and one or more third storage elements 415-*c* may be a flip-flop. Additionally or alternatively, each storage element of one or more fourth storage elements 415-*d*, one or more fifth storage elements 415-*e*, one or more sixth storage elements 415-*f*, and one or more seventh storage elements 415-*g* may be a latch (e.g., a D latch). Alternatively, any of storage elements 415 may be any edge-triggered or level-triggered storage element.

One or more first storage elements 415-*a* may have two input lines 405-*a* and 410 *a* and one output line 420-*a*; one or more second storage elements 415-*b* may have two input lines 405-*b* and 410-*b* and one output line 420-*b*; and one or more third storage elements 415-*c* may have two input lines 405-*c* and 410-*c* and one output line 420-*c*. One or more fourth storage elements 415-*d* may be coupled with one or more first storage elements via line 420-*c* and may also have an additional input line 412. Additionally, one or more fourth storage elements 415-*d* may have an output line 425. One or more fifth storage elements 415-*e* may be coupled with one or more fourth storage elements 415-*d* via line 425; one or more sixth storage elements 415-*f* may be coupled with one or more second storage elements 415-*b* via line 420-*b*; one or more seventh storage elements 415-*g* may be coupled with one or more third storage elements 415-*c* via line 420-*c*. Each of one or more fifth storage elements 415-*e*, one or more sixth storage elements 415-*f*, and one or more seventh storage elements 415-*g* may have input line 430 and output line 435.

In some examples, after a memory device receives a first activate command (e.g., Activate 0) that indicates a first set of bits, the one or more first storage elements 415-*a* may receive a pulse along line 410-*a* (e.g., RACT0) that configures the one or more first storage elements 415-*a* to store the first set of bits received along line 405-*a* (e.g., CAi) and to output a first delayed signal of the first set of bits along line 420-*a* (e.g., RRi). Similarly, after the memory device receives a second activate command (e.g., Activate 1) that indicates a second set of bits, the one or more second storage elements 415-*b* may receive a pulse along line 410-*b* (e.g., RACT1) that configures the one or more second storage elements 415-*b* to store the second set of bits received along line 405-*b* (e.g., CAj) to output a first delayed signal of the second set of bits along line 420-*b* (e.g., RRj). Additionally, after the memory device receives a third activate command (e.g., Activate 2) that indicates a third set of bits, the one or more third storage elements 415-*c* may receive a pulse along line 410-*c* (e.g., RACT2) that configures the one or more third storage elements 415-*c* to store the third set of bits received along line 405-*c* (e.g., CAk) to output a first delayed signal of the third set of bits along line 420-*c* (e.g., RRk).

In some examples, the one or more fourth storage elements 415-*d* may receive a pulse along line 412 associated with the third activate command (e.g., RACT2) that configures the one or more fourth storage elements 415-*d* to store the first set of bits received along line 420-*a* to output a second delayed signal of the first set of bits along line 425 (e.g., RRi_2nd). In other examples, the pulse along line 412 may be associated with the second activate command (e.g., RACT1). In some examples, one or more fifth storage elements 415-*e*, one or more sixth storage elements 415-*f*, and one or more seventh storage elements 415-*g* may receive a pulse along line 430 (e.g., REXAL) that configures the one or more fifth storage elements 415-*e* to store the first set of bits received along line 425, the one or more sixth storage elements 415-*f* to store the second set of bits received along line 420-*b*, and the one or more seventh storage elements 415-*g* to store the third set of bits received along line 420-*c*. After receiving the pulse along line 430, the one or more fifth storage elements 415-*e*, one or more sixth storage elements 415-*f*, and one or more seventh storage elements 415-*g* may output a row address associated with the first set of bits, the second set of bits, and the third set of bits along line 435. In some examples, the pulse along line 430 may be a delayed version of the pulse along line 410-*c* and/or 412 (e.g., RACT2).

Using a double buffer in the form of one or more first storage elements 415-*a* and one or more fourth storage elements 415-*d* may enable the circuit 400 to retain flexible timing for reception of an Activate 0 while preventing the circuit 400 from outputting an invalid or incorrect address. For instance, the memory device may receive a fourth activate command (e.g., another Activate 0) that indicates a fourth set of bits. In some examples, the one or more first storage elements 415-*a* may receive a second pulse along line 410-*a* that configures the one or more first storage elements 415-*a* to store the fourth set of bits received along line 405-*a* and to output a first delayed signal of the fourth set of bits. However, since the one or more fourth storage elements are not configured to store the fourth set of bits until another activate command for the one or more third storage elements 415-*c* is received (e.g., an Activate 2), the one or more fifth storage elements 415-*e* may not store the fourth set of bits when the pulse along line 430 (e.g., REXAL) is applied for storage of the first, second, and third sets of bits. Accordingly, the line 435 may not output a row address that is invalid or incorrect due to the fourth set of bits being stored at one or more fifth storage elements 415-*e* when the pulse along line 430 is applied.

Figure 5:
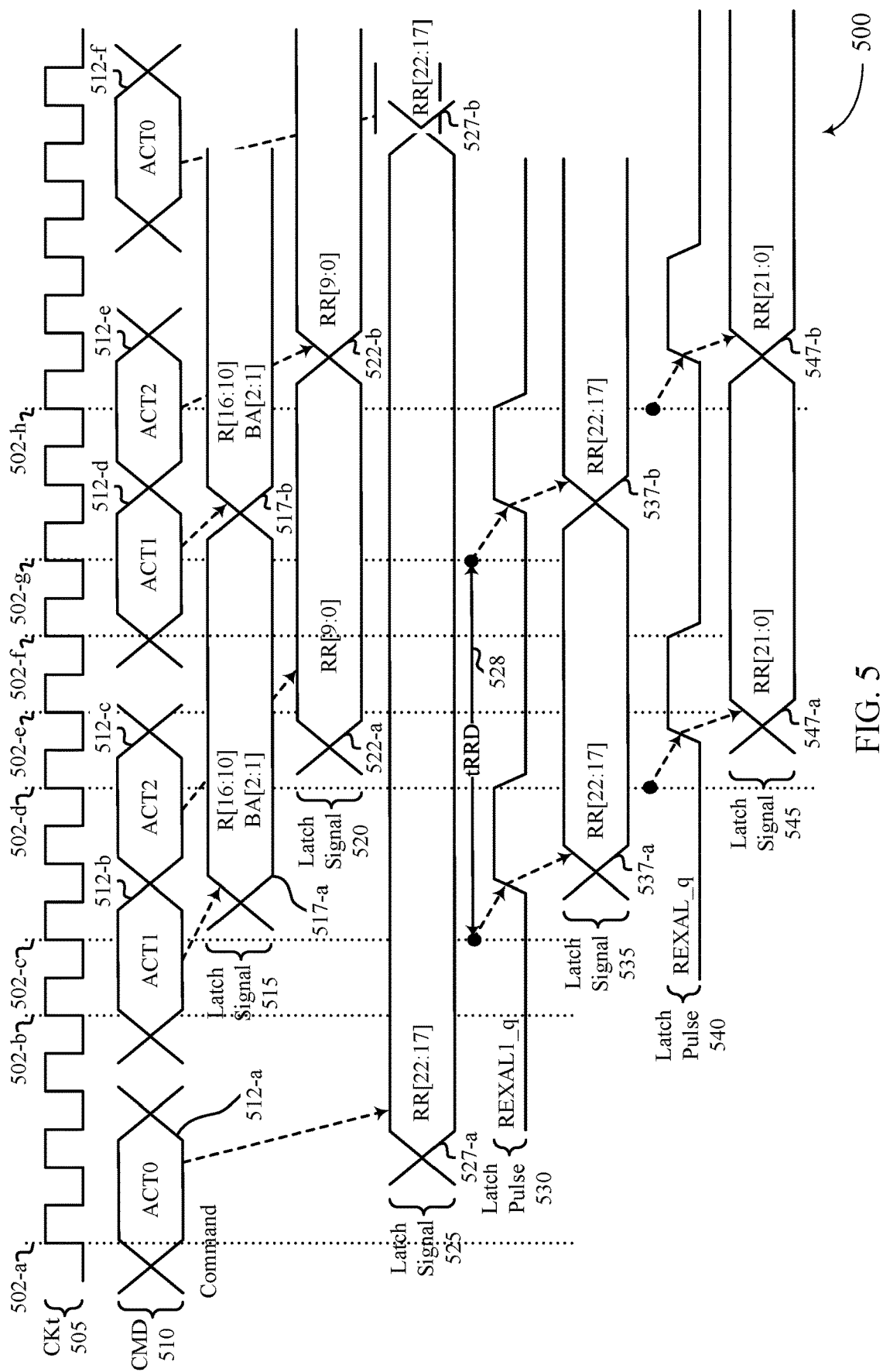
FIG. 5 illustrates an example of a timing diagram that supports triple activate command row address latching in accordance with examples as disclosed herein.

FIG. 5 illustrates an example of a timing diagram 500 that supports triple activate command row address latching in accordance with examples as disclosed herein.

Clock signal 505 may represent a signal produced by a clock (e.g., a clock of a host device coupled with the memory device). Command signal 510 may represent signals associated with one or more commands received by the memory device (e.g., activate commands 512-*a* through 512-*f*). Internal row address signal 515 and 520, and 525 may each represent signals output by storage elements that store bits associated with the one or more commands. For instance, latch signal 515 may be associated with an output of one or more second storage elements 415-*b* as described with reference to FIG. 4; latch signal 520 may be associated with an output of one or more third storage elements 415-*c* as described with reference to FIG. 4; latch signal 525 may be associated with an output of one or more first storage elements 415-*a* as described with reference to FIG. 4; latch signal 535 may be associated with an output of one or more fourth storage elements 415-*d* as described with reference to FIG. 4; and latch signal 545 may be associated with an output of one or more fifth storage elements 415-*e*, one or more sixth storage elements 415-*f*, and one or more seventh storage elements 415-*g* as described with reference to FIG. 4. Additionally, latch pulse 530 may depict a pulse along line 412 and latch pulse 540 may depict a pulse along line 430 each as described with reference to FIG. 4.

At 502-*a*, the memory device may receive a first activate command 512-*a* (e.g., a first Activate 0) that may indicate a first set of bits (e.g., row address bits 17 through 22). It should be noted that the quantity of row address bits are described herein for illustrative purposes and that the quantity of row address bits may vary without deviating from the scope of the disclosure. Additionally, it should be noted that the activated row address may be a subset of the bits indicated by the activate commands and/or that the activate commands may indicate bits other than those associated with the row address (e.g., the bank address). Additionally or alternatively, Upon receiving the first activate command 512-*a*, the memory device may store the first set of bits at one or more first storage elements 415-*a* to obtain a first delayed signal 527-*a* of the first set of bits along line 420-*a*.

At 502-*b*, the memory device may receive a second activate command 512-*b* (e.g., a first Activate 1) that may indicate a second set of bits (e.g., row address bits 10 through 16). Additionally, second activate command 512-*b* may include a bank address (e.g., two bits or three bits). Upon receiving the second activate command 512-*b*, the memory device may store the second set of bits at one or more second storage elements 415-*b* to obtain a first delayed signal 517-*a* of the second set of bits along line 420-*b*. At 502-*c* (e.g., in examples in which the pulse along line 412 is associated with an Activate 1, such as RACT1), a first pulse of latch pulse 530 and associated with the second activate command 512-*b* may be applied to line 412. In response, the one or more fourth storage elements 415-*d* may store the first set of bits at one or more fourth storage elements 415-*d* to obtain a second delayed signal 537-*a* of the first set of bits along line 420-*d*.

After receiving the second activate command 512-*b*, the memory device may receive a third activate command 512-*c* (e.g., a first Activate 2) that indicates a third set of bits (e.g., row address bits 0 through 9). Upon receiving the third activate command, the memory device may store the third set of bits at one or more third storage elements 415-*c* to obtain a first delayed signal 522-*a* of the third set of bits. At 502-*d*, a first pulse of latch pulse 540 and associated with the third activate command 512-*c* may be applied to line 430. In response, the one or more fifth storage elements 415-*e* may store the first set of bits along line 425, the one or more sixth storage elements 415-*f* may store the second set of bits along line 420-*b*, and the one or more seventh storage elements 415-*g* may store the third set of bits along line 420-*c* to obtain a delayed signal 547-*a* of a first row address to activate (e.g., at 502-*e*). Additionally, at 502-*d*, the first pulse of latch pulse 530 may cease, begin to cease, or be ceased.

At 502-*f*, the memory device may receive a fourth activate command 512-*d* (e.g., a second Activate 1) that may indicate a fourth set of bits (e.g., row address bits 10 through 16). In some examples, fourth activate command 512-*d* may include bank address information (e.g., two bits or three bits). Upon receiving the fourth activate command 512-*d*, the memory device may store the fourth set of bits at one or more second storage elements 415-*b* to obtain a first delayed signal 517-*b* of the fourth set of bits along line 420-*b*. Additionally, at 502-*f*, the first pulse of latch pulse 540 may be de-asserted. The present example may correspond to the one or more storage elements described herein being level-triggered. However, it should be noted that present techniques may also be applied to examples in which the one or more storage elements are edge-triggered, in which case a rising or falling edge may be used.

At 502-*g* (e.g., in examples in which the pulse along line 412 is associated with an Activate 1, such as RACT1), a second pulse of latch pulse 530 and associated with the fourth activate command 512-*d* may be applied to line 412. In response, the one or more fourth storage elements 415-*d* may continue to store the first set of bits at one or more fourth storage elements 415-*d* to obtain a third delayed signal 537-*b* of the first set of bits along line 420-*d*. In some examples, the time between 502-*d* and 502-*g* may be equivalent to tRRD 528 (e.g., a row to row delay).

After receiving the fourth activate command 512-*d*, the memory device may receive a fifth activate command 512-*e* (e.g., a second Activate 2) that indicates a fifth set of bits (e.g., row address bits 0 through 9). Upon receiving the fifth activate command 512-*e*, the memory device may store the fifth set of bits at one or more third storage elements 415-*c* to obtain a first delayed signal 522-*b* of the fifth set of bits.

At 502-*h*, a second pulse of latch pulse 540 and associated with the fifth activate command 512-*e* may be applied to line 430. In response, the one or more fifth storage elements 415-*e* may store the first set of bits along line 425, the one or more sixth storage elements 415-*f* may store the fourth set of bits along line 420-*b*, and the one or more seventh storage elements 415-*g* may store the fifth set of bits along line 420-*c* to obtain a delayed signal 547-*b* of a second row address to activate (e.g., at 502-*e*). In examples in which the first set of bits is sticky (e.g., not changed for at least two instances of an Activate 1), the first set of bits may be used for both the first row address and the second row address. Additionally, at 502-*h*, the second pulse of latch pulse 530 may cease, begin to cease, or be ceased.

After receiving the fifth activate command 512-*e*, the memory device may receive a sixth activate command 512-*f* (e.g., a second Activate 0) that may indicate a sixth set of bits (e.g., row address bits 17 through 22). Upon receiving the sixth activate command 512-*f*, the memory device may store the sixth set of bits at one or more first storage elements 415-*a* to obtain a first delayed signal 527-*b* of the sixth set of bits along line 420-*a*.

In examples in which one or more fourth storage elements 415-*d* are not present, 502-*f* may represent the minimum time at which latch signal 535 may change such that an invalid or incorrect row address is not output. Accordingly, a time duration between receiving command 512-*c* and 502-*f* may represent a minimum duration for which the memory device is to not receive an Activate 0 (e.g., a clock cycle). However, in examples in which the one or more fourth storage elements 415-*d* are present, receiving the Activate 0 may not adjust the bits stored in the one or more fourth storage elements 415-*d*. Accordingly, the memory device may still output a valid or correct row address, even in examples in which an Activate 0 is received before the minimum duration has occurred. Thus, the memory device may employ more flexible row address timing.

Figure 6:
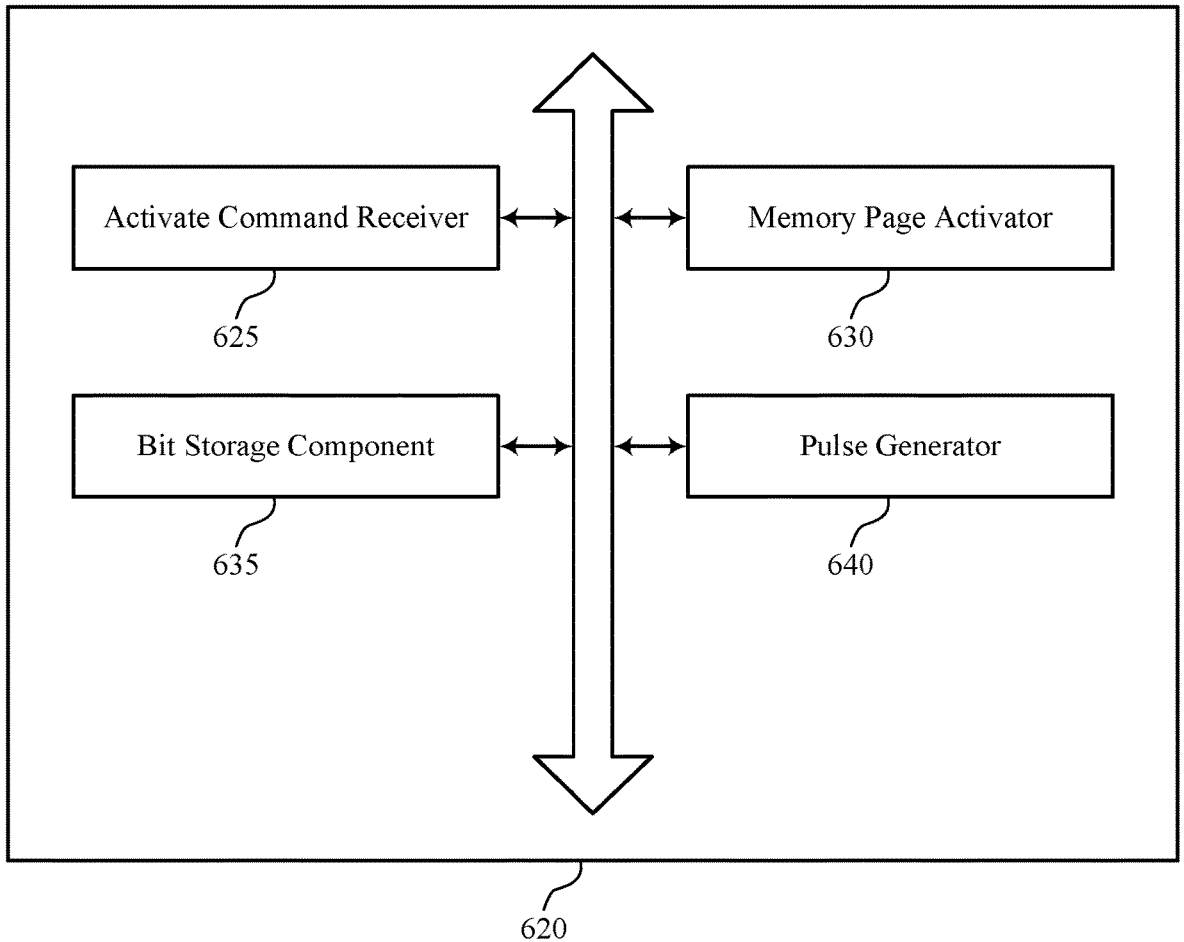
FIG. 6 shows a block diagram of a memory device that supports triple activate command row address latching in accordance with examples as disclosed herein.

FIG. 6 shows a block diagram 600 of a memory device 620 that supports triple activate command row address latching in accordance with examples as disclosed herein. The memory device 620 may be an example of aspects of a memory device as described with reference to FIGS. 1 through 5. The memory device 620, or various components thereof, may be an example of means for performing various aspects of triple activate command row address latching as described herein. For example, the memory device 620 may include an activate command receiver 625, a memory page activator 630, a bit storage component 635, a pulse generator 640, or any combination thereof. Each of these components may communicate, directly or indirectly, with one another (e.g., via one or more buses).

The activate command receiver 625 may be configured as or otherwise support a means for receiving a first activate command that indicates a first set of bits of a row address. In some examples, the activate command receiver 625 may be configured as or otherwise support a means for receiving a second activate command that indicates a second set of bits of the row address. In some examples, the activate command receiver 625 may be configured as or otherwise support a means for receiving a third activate command that indicates a third set of bits of the row address. The memory page activator 630 may be configured as or otherwise support a means for activating a page of memory based at least in part on receiving the first activate command, the second activate command, and the third activate command, where the page of memory is addressed according to the first set of bits, the second set of bits, and the third set of bits.

In some examples, the bit storage component 635 may be configured as or otherwise support a means for storing the first set of bits based at least in part on receiving the first activate command to obtain a delayed signal of the first set of bits. In some examples, the bit storage component 635 may be configured as or otherwise support a means for storing the second set of bits based at least in part on receiving the second activate command to obtain a delayed signal of the second set of bits. In some examples, the bit storage component 635 may be configured as or otherwise support a means for storing the third set of bits based at least in part on receiving the third activate command to obtain a delayed signal of the third set of bits, where the page of memory is addressed based at least in part on the delayed signal of the first set of bits, the delayed signal of the second set of bits, and the delayed signal of the third set of bits.

In some examples, the bit storage component 635 may be configured as or otherwise support a means for storing the first set of bits to obtain a second delayed signal of the first set of bits based at least in part on the delayed signal of the first set of bits. In some examples, the bit storage component 635 may be configured as or otherwise support a means for storing the second set of bits to obtain a second delayed signal of the second set of bits based at least in part on the delayed signal of the second set of bits. In some examples, the bit storage component 635 may be configured as or otherwise support a means for storing the third set of bits to obtain a second delayed signal of the third set of bits based at least in part on the delayed signal of the third set of bits, where the page of memory is addressed based at least in part on the second delayed signal of the first set of bits, the second delayed signal of the second set of bits, and the second delayed signal of the third set of bits.

In some examples, the pulse generator 640 may be configured as or otherwise support a means for generating a first pulse based at least in part on the third activate command, where storing the third set of bits to obtain the delayed signal is based at least in part on the first pulse. In some examples, the pulse generator 640 may be configured as or otherwise support a means for generating a second pulse based at least in part on the third activate command, where storing the first set of bits to obtain the second delayed signal of the first set of bits, the second set of bits to obtain the second delayed signal of the second set of bits, and the third set of bits obtain the second delayed signal of the third set of bits is based at least in part on the second pulse.

In some examples, for the row address, each of the first set of bits is more significant than each bit of the second set of bits. In some examples, each bit of the second set of bits is more significant than each bit of the third set of bits.

In some examples, the second activate command is received after the first activate command and before the third activate command.

In some examples, the second activate command indicates a selected bank for the page of memory.

Figure 7:
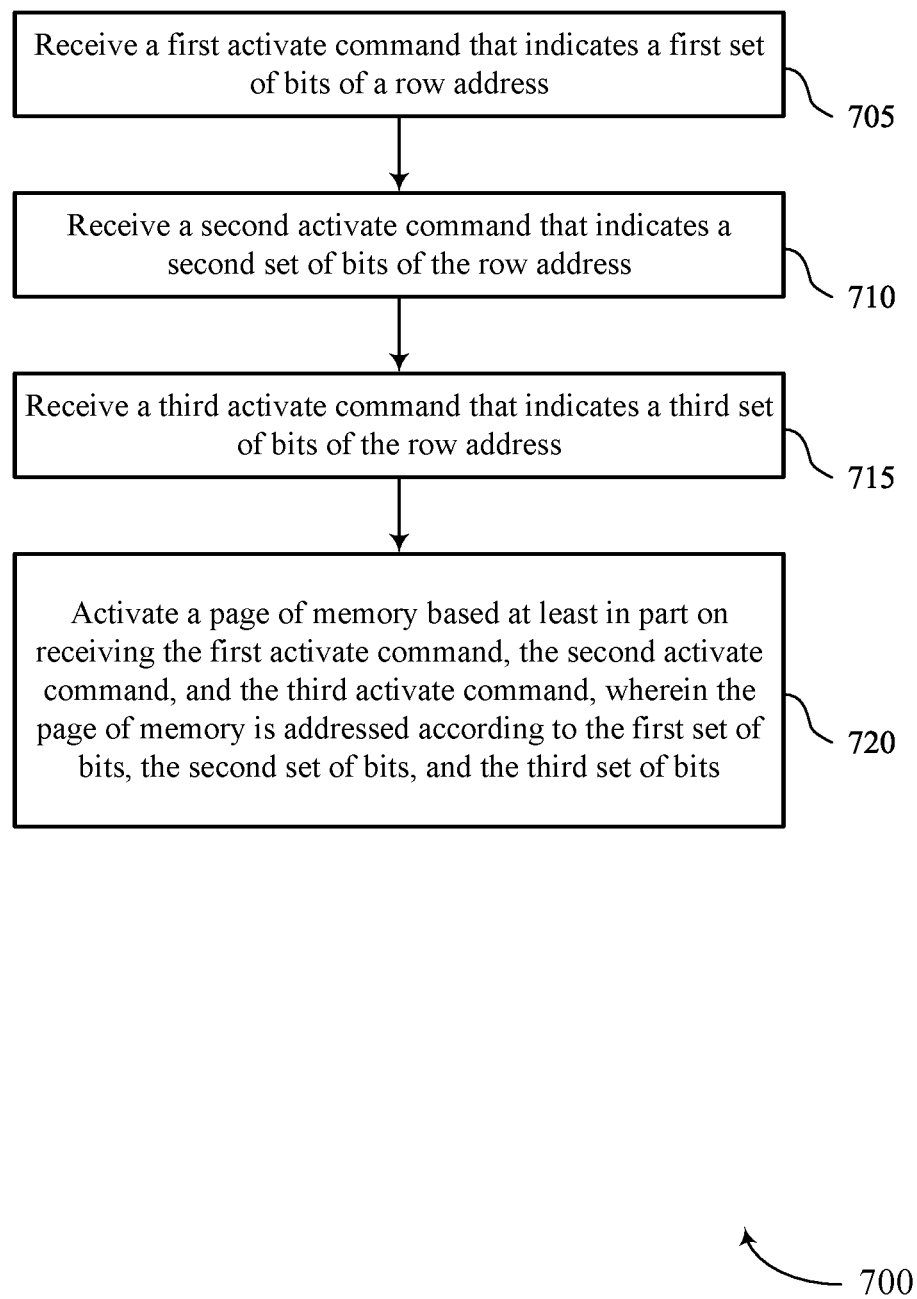
FIG. 7 shows a flowchart illustrating a method or methods that support triple activate command row address latching in accordance with examples as disclosed herein.

FIG. 7 shows a flowchart illustrating a method 700 that supports triple activate command row address latching in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include receiving a first activate command that indicates a first set of bits of a row address. The operations of 705 may be performed in accordance with examples as disclosed herein. In some examples, aspects of the operations of 705 may be performed by an activate command receiver 625 as described with reference to FIG. 6.

At 710, the method may include receiving a second activate command that indicates a second set of bits of the row address. The operations of 710 may be performed in accordance with examples as disclosed herein. In some examples, aspects of the operations of 710 may be performed by an activate command receiver 625 as described with reference to FIG. 6.

At 715, the method may include receiving a third activate command that indicates a third set of bits of the row address. The operations of 715 may be performed in accordance with examples as disclosed herein. In some examples, aspects of the operations of 715 may be performed by an activate command receiver 625 as described with reference to FIG. 6.

At 720, the method may include activating a page of memory based at least in part on receiving the first activate command, the second activate command, and the third activate command, where the page of memory is addressed according to the first set of bits, the second set of bits, and the third set of bits. The operations of 720 may be performed in accordance with examples as disclosed herein. In some examples, aspects of the operations of 720 may be performed by a memory page activator 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a first activate command that indicates a first set of bits of a row address; receiving a second activate command that indicates a second set of bits of the row address; receiving a third activate command that indicates a third set of bits of the row address; and activating a page of memory based at least in part on receiving the first activate command, the second activate command, and the third activate command, where the page of memory is addressed according to the first set of bits, the second set of bits, and the third set of bits.

Aspect 2: The method, apparatus, or non-transitory computer-readable medium of aspect 1, further including operations, features, circuitry, logic, means, or instructions, or any combination thereof for storing the first set of bits based at least in part on receiving the first activate command to obtain a delayed signal of the first set of bits; storing the second set of bits based at least in part on receiving the second activate command to obtain a delayed signal of the second set of bits; and storing the third set of bits based at least in part on receiving the third activate command to obtain a delayed signal of the third set of bits, where the page of memory is addressed based at least in part on the delayed signal of the first set of bits, the delayed signal of the second set of bits, and the delayed signal of the third set of bits.

Aspect 3: The method, apparatus, or non-transitory computer-readable medium of aspect 2, further including operations, features, circuitry, logic, means, or instructions, or any combination thereof for storing the first set of bits to obtain a second delayed signal of the first set of bits based at least in part on the delayed signal of the first set of bits; storing the second set of bits to obtain a second delayed signal of the second set of bits based at least in part on the delayed signal of the second set of bits; and storing the third set of bits to obtain a second delayed signal of the third set of bits based at least in part on the delayed signal of the third set of bits, where the page of memory is addressed based at least in part on the second delayed signal of the first set of bits, the second delayed signal of the second set of bits, and the second delayed signal of the third set of bits.

Aspect 4: The method, apparatus, or non-transitory computer-readable medium of aspect 3, further including operations, features, circuitry, logic, means, or instructions, or any combination thereof for generating a first pulse based at least in part on the third activate command, where storing the third set of bits to obtain the delayed signal is based at least in part on the first pulse and generating a second pulse based at least in part on the third activate command, where storing the first set of bits to obtain the second delayed signal of the first set of bits, the second set of bits to obtain the second delayed signal of the second set of bits, and the third set of bits obtain the second delayed signal of the third set of bits is based at least in part on the second pulse.

Aspect 5: The method, apparatus, or non-transitory computer-readable medium of any of aspects 1 through 4, where for the row address, each of the first set of bits is more significant than each bit of the second set of bits and each bit of the second set of bits is more significant than each bit of the third set of bits.

Aspect 6: The method, apparatus, or non-transitory computer-readable medium of any of aspects 1 through 5, where the second activate command is received after the first activate command and before the third activate command.

Aspect 7: The method, apparatus, or non-transitory computer-readable medium of any of aspects 1 through 6, where the second activate command indicates a selected bank for the page of memory.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 8: An apparatus, including: one or more first storage elements configured to store a first set of bits based at least in part on a first activate command to obtain a delayed signal of the first set of bits; one or more second storage elements configured to store a second set of bits based at least in part on a second activate command to obtain a delayed signal of the second set of bits; one or more third storage elements configured to store a third set of bits based at least in part on a third activate command to obtain a delayed signal of the third set of bits; and a circuit configured to activate a page of memory based at least in part on the third activate command, where the page of memory is addressed based at least in part on the delayed signal of the first set of bits, the delayed signal of the second set of bits, and the delayed signal of the third set of bits.

Aspect 9: The apparatus of aspect 8, further including: one or more fourth storage elements configured to store the first set of bits delayed according to the delayed signal of the first set of bits to obtain a second delayed signal of the first set of bits; one or more fifth storage elements configured to store the second set of bits delayed according to the delayed signal of the second set of bits to obtain a second delayed signal of the second set of bits; and one or more sixth storage elements configured to store the third set of bits delayed according to the delayed signal of the third set of bits to obtain a second delayed signal of the third set of bits, where the page of memory is addressed based at least in part on the second delayed signal of the first set of bits, the second delayed signal of the second set of bits, and the second delayed signal of the third set of bits.

Aspect 10: The apparatus of aspect 9, where the one or more first storage elements are coupled with the one or more fourth storage elements, the one or more second storage elements are coupled with the one or more fifth storage elements, and the one or more third storage elements are coupled with the one or more sixth storage elements.

Aspect 11: The apparatus of any of aspects 8 through 10, where each of the one or more first storage elements, the one or more second storage elements, the one or more third storage elements includes a flip-flop and each of the one or more fourth storage elements, the one or more fifth storage elements, the one or more sixth storage elements includes a latch.

Aspect 12: The apparatus of any of aspects 8 through 11, where activating the page of memory includes activating a set of ferroelectric memory cells.

Aspect 13: The apparatus of any of aspects 8 through 12, where for the row address, each of the first set of bits is more significant than each bit of the second set of bits, and each bit of the second set of bits is more significant than each bit of the third set of bits.

Aspect 14: The apparatus of any of aspects 8 through 13, where the second activate command indicates a selected bank for the page of memory.

An apparatus is described. The following provides an overview of aspects of the apparatus as described herein:

Aspect 15: An apparatus, including: a memory device; and a circuit coupled with the memory device and configured to cause the apparatus to: receive a first activate command that indicates a first set of bits of a row address; receive a second activate command that indicates a second set of bits of the row address; receive a third activate command that indicates a third set of bits of the row address; and activate a page of memory based at least in part on receiving the first activate command, the second activate command, and the third activate command, where the page of memory is addressed according to the first set of bits, the second set of bits, and the third set of bits.

Aspect 16: The apparatus of aspect 15, where the circuit is further configured to cause the apparatus to: store the first set of bits based at least in part on receiving the first activate command to obtain a delayed signal of the first set of bits; store the second set of bits based at least in part on receiving the second activate command to obtain a delayed signal of the second set of bits; and store the third set of bits based at least in part on receiving the third activate command to obtain a delayed signal of the third set of bits, where the page of memory is addressed based at least in part on the delayed signal of the first set of bits, the delayed signal of the second set of bits, and the delayed signal of the third set of bits.

Aspect 17: The apparatus of aspect 16, where the circuit is further configured to cause the apparatus to: store the first set of bits to obtain a second delayed signal of the first set of bits based at least in part on the delayed signal of the first set of bits; store the second set of bits to obtain a second delayed signal of the second set of bits based at least in part on the delayed signal of the second set of bits; and store the third set of bits to obtain a second delayed signal of the third set of bits based at least in part on the delayed signal of the third set of bits, where the page of memory is addressed based at least in part on the second delayed signal of the first set of bits, the second delayed signal of the second set of bits, and the second delayed signal of the third set of bits.

Aspect 18: The apparatus of aspect 17, where the circuit is further configured to cause the apparatus to: generate a first pulse based at least in part on the third activate command, where storing the third set of bits to obtain the delayed signal is based at least in part on the first pulse; and generate a second pulse based at least in part on the third activate command, where storing the first set of bits to obtain the second delayed signal of the first set of bits, the second set of bits to obtain the second delayed signal of the second set of bits, and the third set of bits obtain the second delayed signal of the third set of bits is based at least in part on the second pulse.

Aspect 19: The apparatus of any of aspects 15 through 18, where for the row address, each of the first set of bits is more significant than each bit of the second set of bits, and each bit of the second set of bits is more significant than each bit of the third set of bits.

Aspect 20: The apparatus of any of aspects 15 through 19, where the second activate command is received after the first activate command and before the third activate command.

Aspect 21: The apparatus of any of aspects 15 through 20, where the second activate command indicates a selected bank for the page of memory.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving a first activate command that indicates a first set of row address bits indicative of a first portion of a row address;
   receiving, after receiving the first activate command, a second activate command that indicates a second set of row address bits indicative of a second portion of the row address;
   receiving, after receiving the second activate command, a third activate command that indicates a third set of row address bits indicative of a third portion of the row address; and
   activating a row of memory cells based at least in part on receiving the first activate command, the second activate command, and the third activate command, wherein the row of memory cells is addressed according to the first set of row address bits, the second set of row address bits, and the third set of row address bits.

2. The method of claim 1, further comprising:
   storing the first set of row address bits based at least in part on receiving the first activate command to obtain a delayed signal of the first set of row address bits;
   storing the second set of row address bits based at least in part on receiving the second activate command to obtain a delayed signal of the second set of row address bits; and
   storing the third set of row address bits based at least in part on receiving the third activate command to obtain a delayed signal of the third set of row address bits, wherein the row of memory cells is addressed based at least in part on the delayed signal of the first set of row address bits, the delayed signal of the second set of row address bits, and the delayed signal of the third set of row address bits.

3. The method of claim 2, further comprising:
storing the first set of row address bits to obtain a second delayed signal of the first set of row address bits based at least in part on the delayed signal of the first set of row address bits;
storing the second set of row address bits to obtain a second delayed signal of the second set of row address bits based at least in part on the delayed signal of the second set of row address bits; and
storing the third set of row address bits to obtain a second delayed signal of the third set of row address bits based at least in part on the delayed signal of the third set of row address bits, wherein the row of memory cells is addressed based at least in part on the second delayed signal of the first set of row address bits, the second delayed signal of the second set of row address bits, and the second delayed signal of the third set of row address bits.

4. The method of claim 3, further comprising:
generating a first pulse based at least in part on the third activate command, wherein storing the third set of row address bits to obtain the delayed signal is based at least in part on the first pulse; and
generating a second pulse based at least in part on the third activate command, wherein storing the first set of row address bits to obtain the second delayed signal of the first set of row address bits, the second set of row address bits to obtain the second delayed signal of the second set of row address bits, and the third set of row address bits to obtain the second delayed signal of the third set of row address bits is based at least in part on the second pulse.

5. The method of claim 1, wherein for the row address, each of the first set of row address bits is more significant than each bit of the second set of row address bits, and each row address bit of the second set of row address bits is more significant than each row address bit of the third set of row address bits.

6. The method of claim 1, wherein the second activate command indicates a selected bank for the row of memory cells.

7. The method of claim 1, wherein the first portion of the row address, the second portion of the row address, and the third portion of the row address are respectively different than each other.

8. An apparatus, comprising:
one or more first storage elements configured to store a first set of row address bits indicative of a first portion of a row address based at least in part on a first activate command to obtain a delayed signal of the first set of row address bits;
one or more second storage elements configured to store a second set of row address bits indicative of a second portion of the row address based at least in part on a second activate command received after the first activate command to obtain a delayed signal of the second set of row address bits;
one or more third storage elements configured to store a third set of row address bits indicative of a third portion of the row address based at least in part on a third activate command received after the second activate command to obtain a delayed signal of the third set of row address bits; and
a circuit configured to activate a row of memory cells based at least in part on the first activate command, the second activate command, and the third activate command, wherein the row of memory cells is addressed based at least in part on the delayed signal of the first set of row address bits, the delayed signal of the second set of row address bits, and the delayed signal of the third set of row address bits.

9. The apparatus of claim 8, further comprising:
one or more fourth storage elements configured to store the first set of row address bits delayed according to the delayed signal of the first set of row address bits to obtain a second delayed signal of the first set of row address bits;
one or more fifth storage elements configured to store the second set of row address bits delayed according to the delayed signal of the second set of row address bits to obtain a second delayed signal of the second set of row address bits; and
one or more sixth storage elements configured to store the third set of row address bits delayed according to the delayed signal of the third set of row address bits to obtain a second delayed signal of the third set of row address bits, wherein the row of memory cells is addressed based at least in part on the second delayed signal of the first set of row address bits, the second delayed signal of the second set of row address bits, and the second delayed signal of the third set of row address bits.

10. The apparatus of claim 9, wherein the one or more first storage elements are coupled with the one or more fourth storage elements, the one or more second storage elements are coupled with the one or more fifth storage elements, and the one or more third storage elements are coupled with the one or more sixth storage elements.

11. The apparatus of claim 9, wherein each of the one or more first storage elements, the one or more second storage elements, the one or more third storage elements comprises a flip-flop and each of the one or more fourth storage elements, the one or more fifth storage elements, the one or more sixth storage elements comprises a latch.

12. The apparatus of claim 8, wherein activating the row of memory cells comprises activating a set of ferroelectric memory cells.

13. The apparatus of claim 8, wherein for the row address, each of the first set of row address bits is more significant than each bit of the second set of row address bits, and each bit of the second set of row address bits is more significant than each bit of the third set of row address bits.

14. The apparatus of claim 8, wherein the second activate command indicates a selected bank for the row of memory cells.

15. An apparatus, comprising:
a memory device; and
a circuit coupled with the memory device and configured to cause the apparatus to:
receive a first activate command that indicates a first set of row address bits indicative of a first portion of a row address;
receive, after receiving the first activate command, a second activate command that indicates a second set of row address bits indicative of a second portion of the row address;

receive, after receiving the second activate command, a third activate command that indicates a third set of row address bits indicative of a third portion of the row address; and activate a row of memory cells based at least in part on receiving the first activate command, the second activate command, and the third activate command, wherein the row of memory cells is addressed according to the first set of row address bits, the second set of row address bits, and the third set of row address bits.

16. The apparatus of claim 15, wherein the circuit is further configured to cause the apparatus to:

store the first set of row address bits based at least in part on receiving the first activate command to obtain a delayed signal of the first set of row address bits;

store the second set of row address bits based at least in part on receiving the second activate command to obtain a delayed signal of the second set of row address bits; and store the third set of row address bits based at least in part on receiving the third activate command to obtain a delayed signal of the third set of row address bits, wherein the row of memory cells is addressed based at least in part on the delayed signal of the first set of row address bits, the delayed signal of the second set of row address bits, and the delayed signal of the third set of row address bits.

17. The apparatus of claim 16, wherein the circuit is further configured to cause the apparatus to:

store the first set of row address bits to obtain a second delayed signal of the first set of row address bits based at least in part on the delayed signal of the first set of row address bits;

store the second set of row address bits to obtain a second delayed signal of the second set of row address bits based at least in part on the delayed signal of the second set of row address bits; and store the third set of row address bits to obtain a second delayed signal of the third set of row address bits based at least in part on the delayed signal of the third set of row address bits, wherein the row of memory cells is addressed based at least in part on the second delayed signal of the first set of row address bits, the second delayed signal of the second set of row address bits, and the second delayed signal of the third set of row address bits.

18. The apparatus of claim 17, wherein the circuit is further configured to cause the apparatus to:

generate a first pulse based at least in part on the third activate command, wherein storing the third set of row address bits to obtain the delayed signal is based at least in part on the first pulse; and generate a second pulse based at least in part on the third activate command, wherein storing the first set of row address bits to obtain the second delayed signal of the first set of row address bits, the second set of row address bits to obtain the second delayed signal of the second set of row address bits, and the third set of row address bits to obtain the second delayed signal of the third set of row address bits is based at least in part on the second pulse.

19. The apparatus of claim 15, wherein for the row address, each of the first set of row address bits is more significant than each bit of the second set of row address bits, and each bit of the second set of row address bits is more significant than each bit of the third set of row address bits.

20. The apparatus of claim 15, wherein the second activate command indicates a selected bank for the row of memory cells.

21. The apparatus of claim 15, wherein the first portion of the row address, the second portion of the row address, and the third portion of the row address are respectively different than each other.

22. An apparatus, comprising:

means for receiving a first activate command that indicates a first set of row address bits indicative of a first portion of a row address;

means for receiving, after receiving the first activate command, a second activate command that indicates a second set of row address bits indicative of a second portion of the row address;

means for receiving, after receiving the second activate command, a third activate command that indicates a third set of row address bits indicative of a third portion of the row address; and means for activating a row of memory cells based at least in part on receiving the first activate command, the second activate command, and the third activate command, wherein the row of memory cells is addressed according to the first set of row address bits, the second set of row address bits, and the third set of row address bits.

23. The apparatus of claim 22, further comprising:

means for storing the first set of row address bits based at least in part on receiving the first activate command to obtain a delayed signal of the first set of row address bits;

means for storing the second set of row address bits based at least in part on receiving the second activate command to obtain a delayed signal of the second set of row address bits; and means for storing the third set of row address bits based at least in part on receiving the third activate command to obtain a delayed signal of the third set of row address bits, wherein the row of memory cells is addressed based at least in part on the delayed signal of the first set of row address bits, the delayed signal of the second set of row address bits, and the delayed signal of the third set of row address bits.

24. The apparatus of claim 23, further comprising:

means for storing the first set of row address bits to obtain a second delayed signal of the first set of row address bits based at least in part on the delayed signal of the first set of row address bits;

means for storing the second set of row address bits to obtain a second delayed signal of the second set of row address bits based at least in part on the delayed signal of the second set of row address bits; and means for storing the third set of row address bits to obtain a second delayed signal of the third set of row address bits based at least in part on the delayed signal of the third set of row address bits, wherein the row of memory cells is addressed based at least in part on the second delayed signal of the first set of row address bits, the second delayed signal of the second set of row address bits, and the second delayed signal of the third set of row address bits.

25. The apparatus of claim 24, further comprising:

means for generating a first pulse based at least in part on the third activate command, wherein storing the third set of row address bits to obtain the delayed signal is based at least in part on the first pulse; and means for generating a second pulse based at least in part on the third activate command, wherein storing the first set of row address bits to obtain the second delayed signal of the first set of row address bits, the second set of row address bits to obtain the second delayed signal of the second set of row address bits, and the third set of row address bits to obtain the second delayed signal of the third set of row address bits is based at least in part on the second pulse.

26. The apparatus of claim 22, wherein for the row address, each of the first set of row address bits is more significant than each bit of the second set of row address bits, and each row address bit of the second set of row address bits is more significant than each row address bit of the third set of row address bits.

27. The apparatus of claim 22, wherein the second activate command indicates a selected bank for the row of memory cells.

28. The apparatus of claim 22, wherein the first portion of the row address, the second portion of the row address, and the third portion of the row address are respectively different than each other.

29. A non-transitory computer-readable medium storing code for wireless communication at a wireless device, the code comprising instructions executable by a processor to:
receive a first activate command that indicates a first set of row address bits indicative of a first portion of a row address;
receive, after receiving the first activate command, a second activate command that indicates a second set of row address bits indicative of a second portion of the row address;
receive, after receiving the second activate command, a third activate command that indicates a third set of row address bits indicative of a third portion of the row address; and
activate a row of memory cells based at least in part on receiving the first activate command, the second activate command, and the third activate command, wherein the row of memory cells is addressed according to the first set of row address bits, the second set of row address bits, and the third set of row address bits.

30. The non-transitory computer-readable medium of claim 29, wherein the instructions are further executable by the processor to:
store the first set of row address bits based at least in part on receiving the first activate command to obtain a delayed signal of the first set of row address bits;
store the second set of row address bits based at least in part on receiving the second activate command to obtain a delayed signal of the second set of row address bits; and
store the third set of row address bits based at least in part on receiving the third activate command to obtain a delayed signal of the third set of row address bits,
wherein the row of memory cells is addressed based at least in part on the delayed signal of the first set of row address bits, the delayed signal of the second set of row address bits, and the delayed signal of the third set of row address bits.

31. The non-transitory computer-readable medium of claim 30, wherein the instructions are further executable by the processor to:
store the first set of row address bits to obtain a second delayed signal of the first set of row address bits based at least in part on the delayed signal of the first set of row address bits;
store the second set of row address bits to obtain a second delayed signal of the second set of row address bits based at least in part on the delayed signal of the second set of row address bits; and
store the third set of row address bits to obtain a second delayed signal of the third set of row address bits based at least in part on the delayed signal of the third set of row address bits, wherein the row of memory cells is addressed based at least in part on the second delayed signal of the first set of row address bits, the second delayed signal of the second set of row address bits, and the second delayed signal of the third set of row address bits.

32. The non-transitory computer-readable medium of claim 31, wherein the instructions are further executable by the processor to:
generate a first pulse based at least in part on the third activate command, wherein storing the third set of row address bits to obtain the delayed signal is based at least in part on the first pulse; and
generate a second pulse based at least in part on the third activate command, wherein storing the first set of row address bits to obtain the second delayed signal of the first set of row address bits, the second set of row address bits to obtain the second delayed signal of the second set of row address bits, and the third set of row address bits to obtain the second delayed signal of the third set of row address bits is based at least in part on the second pulse.

33. The non-transitory computer-readable medium of claim 29, wherein for the row address, each of the first set of row address bits is more significant than each bit of the second set of row address bits, and each bit of the second set of row address bits is more significant than each bit of the third set of row address bits.

34. The non-transitory computer-readable medium of claim 29, wherein the second activate command indicates a selected bank for the row of memory cells.

35. The non-transitory computer-readable medium of claim 29, wherein the first portion of the row address, the second portion of the row address, and the third portion of the row address are respectively different than each other.

* * * * *